United States Patent
Hemingway et al.

(10) Patent No.: US 7,728,273 B2
(45) Date of Patent: Jun. 1, 2010

(54) INFORMATION HANDLING SYSTEM AND PRINTED CIRCUIT BOARD HAVING TEST STRUCTURE FOR MEASURING A CROSSTALK VOLTAGE

(75) Inventors: Randy Hemingway, Pflugerville, TX (US); Aubrey K. Sparkman, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 719 days.

(21) Appl. No.: 11/621,783

(22) Filed: Jan. 10, 2007

(65) Prior Publication Data

US 2008/0164885 A1    Jul. 10, 2008

(51) Int. Cl.
*H01J 40/14* (2006.01)
(52) U.S. Cl. .............................. 250/214 R; 250/559.1
(58) Field of Classification Search ............ 250/214 R, 250/559.1, 559.4; 324/754–761, 158.1, 535, 324/639–663; 29/852, 846, 830, 847; 174/250, 174/255, 262, 264
See application file for complete search history.

(56) References Cited

U.S. PATENT DOCUMENTS

| | | | |
|---|---|---|---|
| 5,502,392 A | 3/1996 | Arjavalingam et al. | |
| 6,297,458 B1 | 10/2001 | McMillan et al. | |
| 6,512,181 B2 | 1/2003 | Okubo et al. | |
| 6,521,841 B2 | 2/2003 | Kawaguchi | |
| 6,670,816 B2 | 12/2003 | Kim et al. | |
| 6,714,026 B2 | 3/2004 | Kronrod | |
| 6,922,062 B2 | 7/2005 | Sparkman | |
| 7,002,360 B2 | 2/2006 | Kronrod | |
| 7,129,732 B1 * | 10/2006 | Knadle ..................... 324/760 |

* cited by examiner

*Primary Examiner*—Que T Le
(74) *Attorney, Agent, or Firm*—Larson Newman & Abel, LLP

(57) ABSTRACT

A non-destructive test structure for printed circuit board characterization and method of testing the same are disclosed. In one form, a method for testing a printed circuit board can include applying a test signal to a first test location of a first test structure associated with a first inner bus layer of a printed circuit board. The method can also include measuring a crosstalk voltage at a second test location operably associated with the first test structure. The method can further include comparing the crosstalk voltage to a crosstalk specification of the printed circuit, board.

10 Claims, 5 Drawing Sheets

INFORMATION HANDLING SYSTEM AND PRINTED CIRCUIT BOARD HAVING TEST STRUCTURE FOR MEASURING A CROSSTALK VOLTAGE

FIELD OF THE DISCLOSURE

The present disclosure relates generally to monitoring printed circuit board fabrication processes. More specifically, the present disclosure relates to non-destructive test structures for printed circuit board characterization and method of testing the same.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Each of the hardware components within an information handling system may include a printed circuit board (PCB). Some conventional PCBs used within information handling systems can include impedance coupons to check the fabrication quality of PCBs. For high performance PCBs, it is desirable for the electrical impedance of the PCB to be controlled such that all data buses function within a desired design specification. To monitor impedance, some conventional PCBs provide impedance coupons having specific lengths, e.g. four (4) inches, six (6) inches, etc., and trace widths resulting in expected measurable impedances. As a quality control inspection tool, the impedance coupons are tested using a Time Domain Reflectometer (TDR) to determine the impedance of the PCB.

Testing impedance coupons is sufficient for predicting performance of some end systems. However, conventional impedance coupons and testing methods fail to monitor application specific performance parameters as quality control metrics for testing PCBs for specific end use systems such as high performance servers, storage devices, etc. Additionally, conventional test methods fail to provide quality control monitors and test methodologies that may be easily implemented within HVM environments.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

Figure 1:
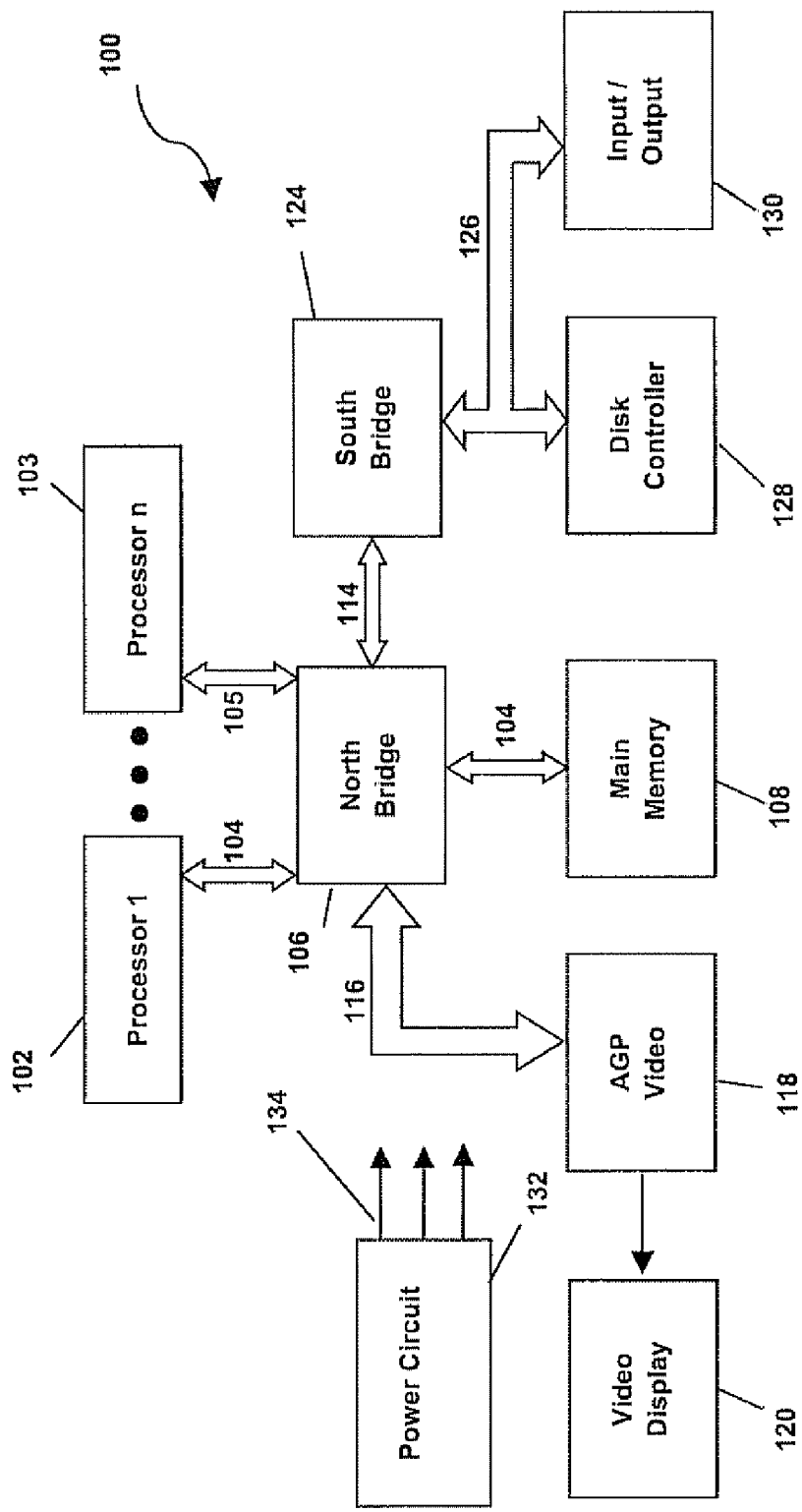
FIG. 1 illustrates a block diagram of an exemplary embodiment of an information handling system employing printed circuit boards.

As indicated above, the following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. For example, much of the following focuses on information handling systems having printed circuit boards with quality verification test structures and methods for testing test structures. However, other teachings may certainly be utilized in this application. The teachings may also be utilized in other applications and with several different types of architectures such as distributed computing architectures, client/server architectures, or middleware server architectures and associated components.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

In one embodiment, a method for testing a printed circuit board can include applying a test signal to a first test location of a first test structure associated with a first inner bus layer of a printed circuit board. The method can also include measuring a crosstalk voltage at a second test location operably associated with the first test structure. The method can further include comparing the crosstalk voltage to a crosstalk specification of the printed circuit board.

In another embodiment, a printed circuit board can include a first test structure located within the printed circuit board at a first bus layer. The first test structure can include a first elongated conductive element extending along a length of the printed circuit board. The first elongated conductive element can include a first width. The first test structure can also include a second elongated conductive element extending approximately parallel to the first elongated conductive element. The second elongated conductive element can also include approximately the length and the first width. The first test structure can also include an expected crosstalk value measurable by applying a test signal to the first elongated conductive element, and measuring a crosstalk voltage using the second elongated conductive element.

In a further embodiment, an information handling system can include a printed circuit board having a first elongated conductive element provided at a first inner bus layer. The first elongated conductive element can include a first length, and a first width approximately equal to a trace width of a bus line provided in association with a first bus located within the first inner bus layer. The printed circuit board can also include a second elongated conductive element provided at the first inner bus layer. The second elongated conductive element can include a second length approximately equal to the first length, and a second width approximately equal to the first width. The printed circuit board can also include an expected crosstalk value associated with the test structure. The expected crosstalk value can be measured by coupling a test signal to the first elongated conductive element. The expected crosstalk value can further be measured by detecting a crosstalk voltage using the second elongated conductive element.

FIG. 1 illustrates a block diagram of an exemplary embodiment of an information handling system that can employ printed circuit boards. In one form, the information handling system is a computer system. The information handling system, generally designated at 100, can include one or more electronic components mounted on a least one PCB (not illustrated) and can communicate data and control signals there between over signal buses which may include constant impedance electrical conductors.

As shown in FIG. 1, the information handling system can include a first physical processor 102, and can include an physical processor 103 coupled to a first host bus 104. The first physical processor 102 can be coupled to a north bridge 106 via the first host bus 104. Further, the $n^{th}$ physical processor 103 can be coupled to the north bridge 106 via a second host bus 105. The north bridge 106 may also be referred to as a memory controller hub or a memory controller, and the north bridge 106 can be coupled to a main system memory 108 via a third host bus 107. In a particular embodiment, the host buses 104, 105, and 107 can be individual buses or part of the same bus.

The north bridge 106 can provide bus control to handle transfers between the host buses 104, 105, 107 and one or more other buses, e.g. a PCI bus 114, and an AGP bus 116 coupled to a video graphics interface 118 which drives a video display 120. A third bus 126 can also include other industry standard buses or proprietary buses, e.g., ISA, SCSI, I2C, SPI, USB buses through a south bridge 124. A disk controller 128 and input/output interface(s) 130 may be connected to the third bus 126 using industry standard buses or proprietary buses or their own respective interfaces, controllers, or combinations thereof. The information handling system 100 may further include a power circuit 132 that can provide input power 134 to the one or more components within the information handling system 100.

The north bridge 106 can be generally considered an application specific chip set that provides connectivity to various buses, and integrates other system functions such as a memory interface. For example, an Intel 820E, 815E chip set, or combinations thereof, available from the Intel Corporation of Santa Clara, Calif., can provide at least a portion of the north bridge 106. The chip set may also be packaged as an application specific integrated circuit (ASIC). The north bridge 106 can generally include functionality to couple the main system memory 108 to other devices within the information handling system 100. Thus, memory controller function such as main memory control functions can reside in the north bridge 106.

In the information handling system 100, one or more PCBs, such as printed circuit board 200 illustrated in FIG. 2 below, can be used to mount and electrically connect the aforementioned electronic components and can include one or more test structures within the printed circuit board to ensure operating specifications of the information handling system 100 can be achieved. For example, relatively high-speed digital circuits can require constant or controlled impedance signal paths having minimal crosstalk voltage or crosstalk interference. Signal paths can be provided to meet expected design specifications for the information handing system 100. As such, degraded signals can be less than desirable during operation of the information handling system 100 and can lead to malfunction or reliability issues. The information handling system 100 using a printed circuit board having test structures ensure a printed circuit board can meet operating specifications of the information handling system 100 prior to installation.

Figure 2:
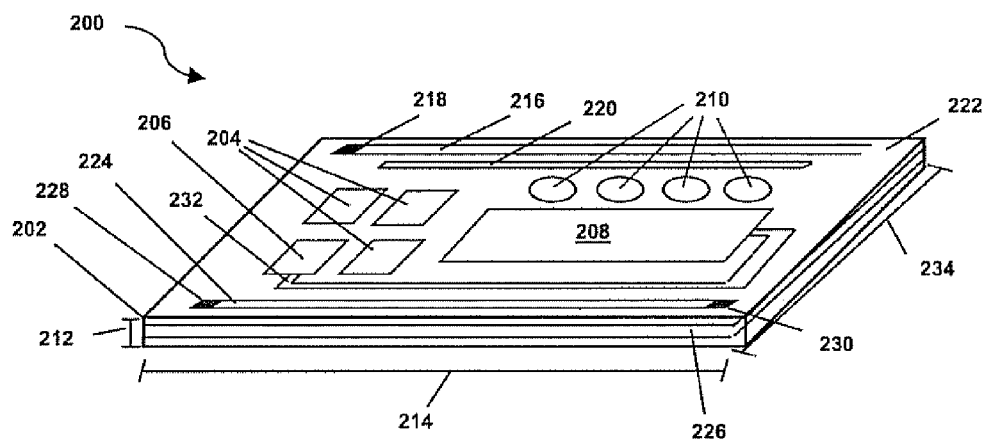
FIG. 2 illustrates a multi-layered printed circuit board incorporating test structures for determining operating characteristics of the printed circuit board according to one aspect of the disclosure.

FIG. 2 presents a multi-layered printed circuit board (PCB), generally designated at 200, and incorporating test structures for determining operating characteristics of the printed circuit board. The PCB 200 can include a multi-layered substrate material 202 for mounting various electronic components such as one or more memory devices 204, a bus controller 206, a processor 208, and various other electronic devices 210. The multi-layered substrate material 202 can include a height 212, a length 214, and a width 234. The PCB 200 can be mounted within a card slot or card mount (not illustrated) of an information handling system such as the information handling system 100 illustrated in FIG. 1.

As depicted in FIG. 2, the PCB 200 can also include a first test structure 216 that can include a contact region 218 for connecting test equipment such as a time domain reflectometer (TDR). The first test structure 216 can be mounted substantially parallel to a first data bus 220 and along a top portion 222 of the PCB 200. The PCB 200 can also include a second test structure 224 mounted at an inner layer 226 of the multi-layered substrate 202. For illustrative purposes, the second test structure 224 appears along the top portion 222 of the PCB 200 however, it should be understood that the second test structure 228 can be provided at an inner layer 226.

In one form, the second test structure 224 can include a first contact region 228 and a second contact region 230 provided at the top surface 222 of the PCB 200. For example, the first contact region 228 and the second contact region 230 can be electrically connected using contact vias (not illustrated) that provide access to the second test structure 224 located at the inner layer 226 of the PCB 200. In one form, the PCB 200 can further include an inner layer data bus 232 provided at the inner layer 226 and connecting the memory controller 232 to the processor 208. In one form, the inner layer data bus 232 can be provided substantially parallel to the second test structure 224. The first test structure 216 and the inner layer data bus 232 can include conductive elements having approximately equal trace widths, lengths, and trace spacing.

During testing, the first test structure 216 can be tested to verify operating characteristics of the PCB 200 through coupling a TDR to contact region 218 of first test structure 216. In one form, a conductive element can be placed across the first test structure 216 along an end portion of the first test structure 216. The first test structure 216 can be tested to determine various operating parameters including an expected crosstalk value of the first test structure 216. Crosstalk can be determined by providing a voltage or signal to a first portion of the first test structure 216 and detecting a crosstalk voltage at a second portion of the test structure 216. Additional parameters, such as signal loss, impedance, and dielectric constant values can also be determined using the first test structure 216.

In one form, the second test structure 224 can be provided in association with the inner layer data bus 232 and at the inner layer 226. The second test structure 224, provided in association with the inner layer data bus 232, can be tested to determine an expected operating characteristic of the inner layer data bus 232. For example, a TDR (not shown) can be connected to the first contact region 228 and the second contact region 230 of second test structure 224. One or more test signals can be provided by the TDR to determine a crosstalk, signal loss, impedance, and dielectric constant values for the second test structure 224.

As such, the PCB 200 can be tested to determine if the PCB 200 meets a specification prior to installation and use. For example, various techniques may be used to analyze the resulting test measurements to determine if the PCB 200 meets a desired specification. For example, impedance limits or specifications can be formed to establish a yield threshold. A maximum crosstalk limit and signal loss limit can be mapped to the impedance limits to form a yield box or target yield for the specific test structure. Additionally, crosstalk measurement data can be used to determine if limitations for yields have been met. As such, various combinations of measurements and measurement analysis can be used to determine if the PCB 200 meets a desired specification.

Figure 3:
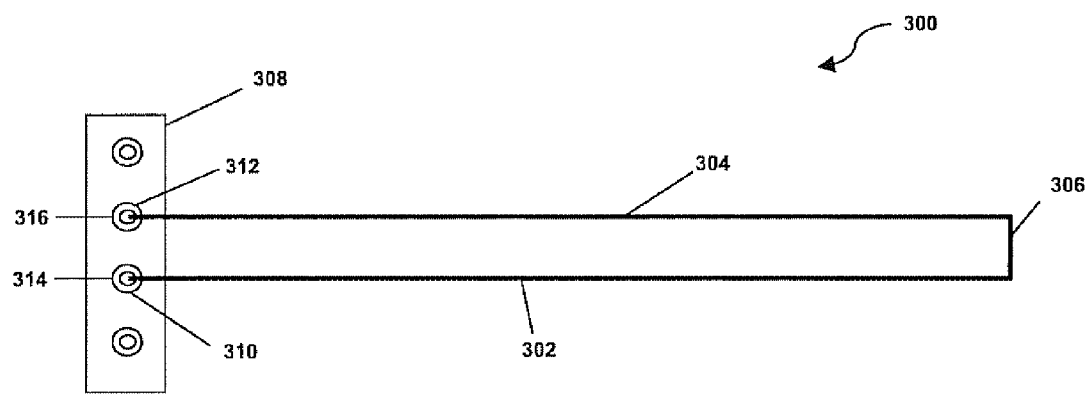
FIG. 3 illustrates a shorted test structure for determining operating characteristics of a printed circuit board according to one aspect of the disclosure.

FIG. 3 illustrates a test structure, generally designated at 300, for determining operating characteristics of a printed circuit board according to one aspect of the disclosure. The test structure 300 may be provided in association with a printed circuit board (PCB), such as the PCB 200 illustrated in FIG. 2, or various other types of PCBs. As shown, the test structure 300 can include a first elongated conductive element 302 and a second elongated conductive element 304 that can be coupled using a conductive shorting element 306. In a particular embodiment, the first elongated conductive element 302 and the second elongated conductive element 304 can include approximately the same length and the approximately the same width. As a result, an impedance of the first elongated conductive element 302 and the second elongated conductive element 304 should be approximately equal. The conductive shorting element 306 can provide an electrical short between the first conductive element 302 and the second elongated conductive element 304, and couple a signal input to the first elongated conductive element 302 to the second elongated conductive element 304.

As illustrated in FIG. 3, the first elongated conductive element 302 and the second elongated conductive element 304 can be coupled to a test terminal 308 including a first test location 310 and a second test location 312. In one form, the test terminal 308 electrical couples the first elongated conductive element 302 using a first test location 310. Similarly, the second elongated conductive element 304 can be coupled to second test location 312. In one form, the first test location 310 and the second test location 312 can be coupled to contact vias operable to electrical couple an inner layer of a PCB to an external contact location. Contact vias are well known in the field of PCB design for providing access to electrical traces, buses, conductors, etc. that may be located at various layers within a PCB.

In one, the test structure 300 can be tested to determine various operating parameters using a simplified test set-up by contacting the test terminal 308 using test equipments such as a TDR (not illustrated). In one form, the test structure 300 can be tested to determine an impedance, crosstalk, signal loss, and dielectric constant values for a PCB. During testing, a user can couple a TDR to the first contact region 310 and the second contact region 312. In one form, TDR equipment vendors such as Polar Instruments, and PCB test system manufactures, such as InterRobotics, may include functionality to allow for testing and characterization of the test structure 300 in association with measuring impedance, crosstalk, signal loss, and dielectric constant values.

During operation of the TDR, a first channel 314 of a TDR can be connected to first test location 310. Additionally, a second channel 316 can be coupled to the second test location 312. The first channel 314 can apply a first test signal to the first test location 310. The second channel 316 can be used to detect receive the signal. For example, a propagation delay can be measured with the TDR in time domain test (TDT) mode. The signal coupled to the first test location 310 can be detected at the second test location 312 and measured using to determine a propagation delay value, a crosstalk value, an impedance value, and signal loss value for the signal provided to first test location 312. The measured values can then be compared to a specification for the PCB to determine of the PCB is within an expectable tolerance.

Figure 4:
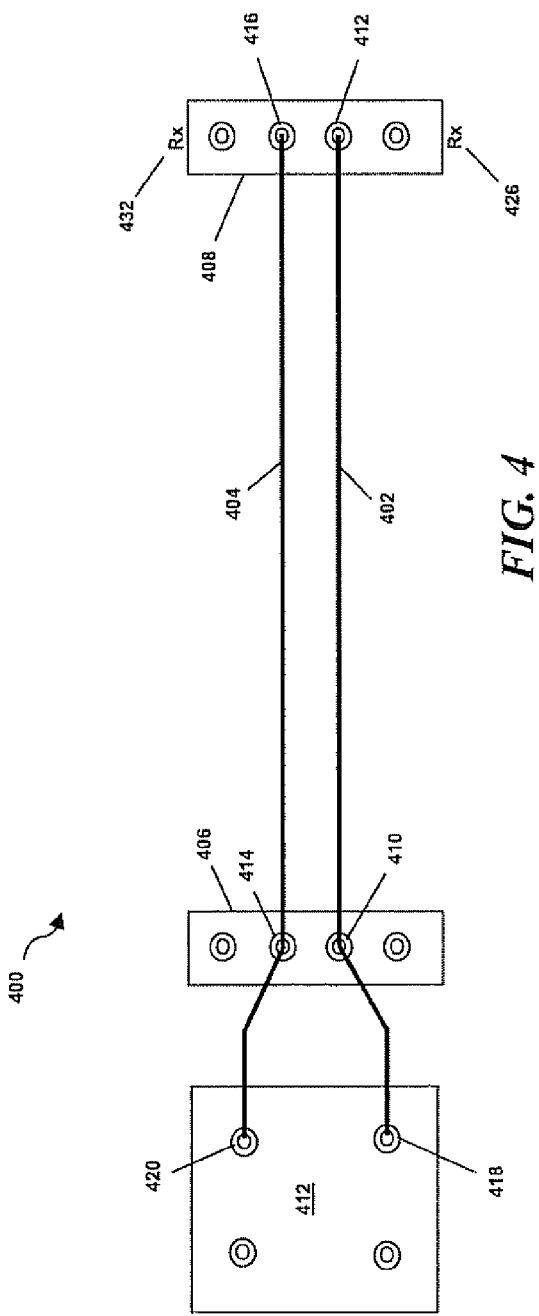
FIG. 4 illustrates an open ended test structure for determining operating characteristics of a printed circuit board according to another aspect of the disclosure.

FIG. 4 illustrates an open-ended test structure, generally designated as test structure 400, for determining operating characteristics of a printed circuit board according to another aspect of the disclosure. The test structure 400 can include a first elongated conductive element 402, and a second elongated conductive element 404 that may extend substantially parallel to the first elongated conductive element 402. In one form, the first elongated conductive element 402 and the second elongated conductive element 404 can be formed of the same conductive material and can include a trace width ranging from approximately four (4) to nine (9) thousandths of an inch. Other dimensions can also be used. In one form, the first elongated conductive element 402 and the second elongated conductive element 404 can include approximately the same trace width and trace spacing. For example, the first elongated conductive element 402 and the second elongated conductive element 404 can include a trace width of approximately five (5) thousandths of one (1) inch, and a trace spacing between the first elongated conductive element 402 and the second elongated conductive element 404 of approximately six (6) thousandths of one (1) inch. Various other widths and trace spacing values can also be used.

In one form, the first elongated conductive element 402 can be coupled to a first test terminal 406 using a first test location 410 of the first test terminal 406, and may be further coupled a second test terminal 408 using a first test location 412 of the second test terminal. Similarly, the second elongated conductive element 404 can be coupled to the first test terminal 406 using a second test location 414 of the first test terminal 406. The second elongated conductive element 404 can also be coupled to the second test terminal 408 using a second test location 416 of the second test terminal 408. In one form, the first test terminal 406 can also be coupled to a reference terminal 412. For example, the first test location 410 can be coupled to a first reference terminal location 418. Additionally, the second test location 414 can be coupled to a second reference terminal location 420.

During testing of the test structure 400, a TDR (not illustrated) can be connected to the reference terminal 412 to determine a reference measurement. For example, the TDR can include a first channel connected to the first reference terminal location 418 and a second channel connected to the second reference terminal location 420. In one form, a TDR may include a stand alone TDR. However, in other embodiments, the TDR may be provided as a part of a PCB test system for testing PCBs. Upon coupling the TDR to the reference terminal 412, a signal can be provided to the first reference terminal location 418 coupled to the first test location 410 of the test structure 400. The TDR can determine an edge rate for the channel one signal. Upon determining an edge rate for the channel one signal, a signal can be provided to using a second channel of the TDR coupled to the second reference terminal location 420. The TDR can also determine a second edge rate for the second signal provided using the channel two signal. The edge rates can be used to establish a reference measurement for subsequent testing of the test structure 400.

Upon determining edge rates using the reference terminal 412, the TDR can be coupled directly to the first test terminal 406. For example, channel one of the TDR can be connected to the first test location 410 and channel two can be connected to the second test location 414. The TDR 420 can then be used to measure the crosstalk, impedance, signal loss, and propagation delay of the test structure 400. For example, a channel two signal output by the TDR can be coupled to the second test location 414 and a differential impedance measurement and odd mode impedance measurement can be made by the TDR.

In another form, a channel one signal can be output by the TDR can be coupled to the first test location 410. A crosstalk value can be measured using channel two of the TDR coupled to the second test terminal 414. Additionally, an impedance value on for channel one can be determine, a propagation delay for channel one and channel two can be determined, and an edge rate for channel one can be determined.

In another form, a channel two signal can be output but the TDR and can be coupled to the second test location 414. A crosstalk value can be measured using channel one of the TDR coupled to the first test terminal 410. Additionally, an impedance value on for channel two can be determined, a propagation delay for channel one and channel two can be determined, and an edge rate for channel two can be determined. Upon making measuring various parameters for the test structure 400, the measured data can be used to determine if an associated PCB meets a specification for the PCB.

Figure 5:
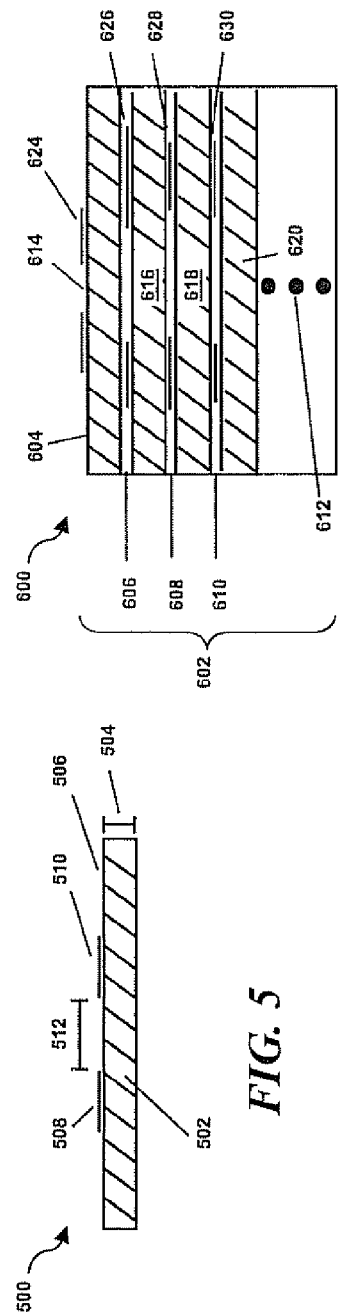
FIG. 5 illustrates a profile view of printed circuit board incorporating a test structure according to one aspect of the disclosure.

FIG. 5 illustrates a profile view of a printed circuit board (PCB) 500 incorporating a test structure for testing an operating characteristic of the PCB 500. The PCB 500 can include a substrate 502 made from a substrate material such as FR4 or other type PCB materials. The substrate can include a thickness 504. A test structure such as test structure 300, test structure 400, or combinations thereof, can be provided along an upper surface 506 of the PCB 500. The test structure can include a first conductive element 508 and a second conductive element 510 spaced at a width 512. In one form, the PCB 500 can include a single bus layer with traces, conductive elements, bus lines, etc. provided along the same layer. Though illustrated as being located along the upper surface 506, single bus later can be provided along an inner portion of the PCB 500.

During quality control testing, the first conductive element 508 and the second conductive element 510 can be tested to determine operating characteristics of the PCB 500. Parameters such as crosstalk voltage, impedance, signal loss, and dielectric constant values can be determined for the PCB 500. The PCB 500 can be tested using the first conductive element 508 and the second conductive element 510 having dimensions and spacing similar an associated data bus. For example, the first conductive element 508 and the second conductive element 510 may include a trace width and trace spacing that are approximately equal to a data bus of the PCB 500. In another embodiment, the first conductive element 508 may include a width that may be greater or less than the width of the second conductive element 510. In this manner, a test signal may be provided along the first conductive element 508 including a larger trace width than the second conductive element 510 and measurements may be made to determine operating characteristics of the PCB 500.

Figure 6:
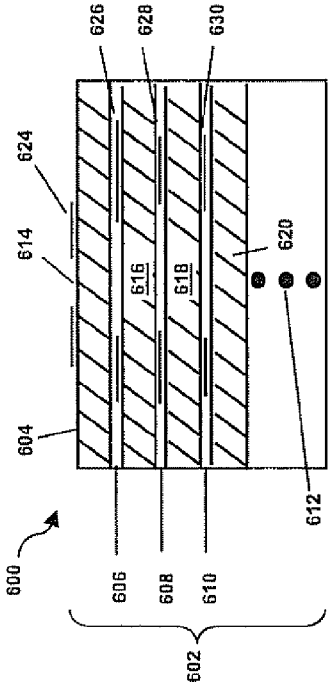
FIG. 6 illustrates a profile view of a multi-layered printed circuit board incorporating various test structures within different layers of a printed circuit board according to one aspect of the disclosure.

FIG. 6 illustrates a profile view of a multi-layered printed circuit board, depicted generally as multi-layered PCB 600, and incorporating various test structures located at different layers of a printed circuit board according to one aspect of the disclosure. The multi-layered PCB 600 can include an overall height 602 and can include multiple inner layers having one or more inner layer data buses. For example, in some applications it may be advantageous to include PCBs having multiple data bus layers to reduce the overall geometric surface area that may be needed for connecting various electronic devices. For example, routing data buses through various layers can reduce the number of traces or conductors that may need to be placed along the top surface 604 of the multi-layered PCB 600.

In a particular embodiment, the multi-layered PCB 600 can include contact vias (not illustrated) for each level that can run vertically to the top surface 604, and can provide access to the inner layers as described below of the multi-layered PCB 600. The multi-layered PCB 600 can further include a first inner bus layer 606, a second inner layer bus 608, and a third inner bus layer 610. Additional layers 612 may also be provided as needed. The multi-layered PCB 600 can further include a substrate material separating each layer. For example, a first substrate material 614 can be provided between the top surface 604 and the first inner bus layer 606. A second substrate material 616 can be provided between the first inner bus layer 606 and the second inner bus layer 608. Additionally, a third substrate material 618 may be provided between the second inner bus layer 608 and the third inner bus layer 610. A fourth substrate material 620 may be provided between the fourth inner bus layer 630 and any additional layers 612.

In a particular embodiment, the multi-layered PCB 600 may also include several test structures provided at various layers of the multi-layered PCB 600. For example, test structures similar to the test structure 300 described in FIG. 3, the test structure 400 described in FIG. 4, other types of test structures such as impedance coupons, or any combination thereof, can be used. For example, impedance coupons (not illustrated) can be provided at a specific layer as desired. The multi-layered PCB 600 can also include a first test structure 624 in association with the top surface 614, a second test structure 626 in association with at the first inner bus layer 606, a third test structure 628 in association with the second inner bus layer 608, and a third test structure 630 in association with the third inner bus layer 610. Each test structure may be provided in association with a bus layer, and can be used to determine operating characteristics of each bus layer by testing each test structure. For example, each bus layer 604, 606, 608, 610, and 612 can operate or perform differently and performance or operation can be effected by the types of materials, and layer location, along the height 602. Additionally, trace lengths of each bus within a specific layer, trace widths, thicknesses, and spacing of each bus, the various materials used to construct each bus layer, and types of substrate materials used for each layer can also effect performance. As such, test structures 624, 626, 628, and 630 can be provided at each bus layer 604, 606, 608, 610, and 612 with an associated bus to predict the operating performance of each bus layer for the multi-layered PCB 600. In this manner, PCB manufacturing processes can be monitored through testing one or more of the test structures 624, 626, 628, and 630.

Figure 7:
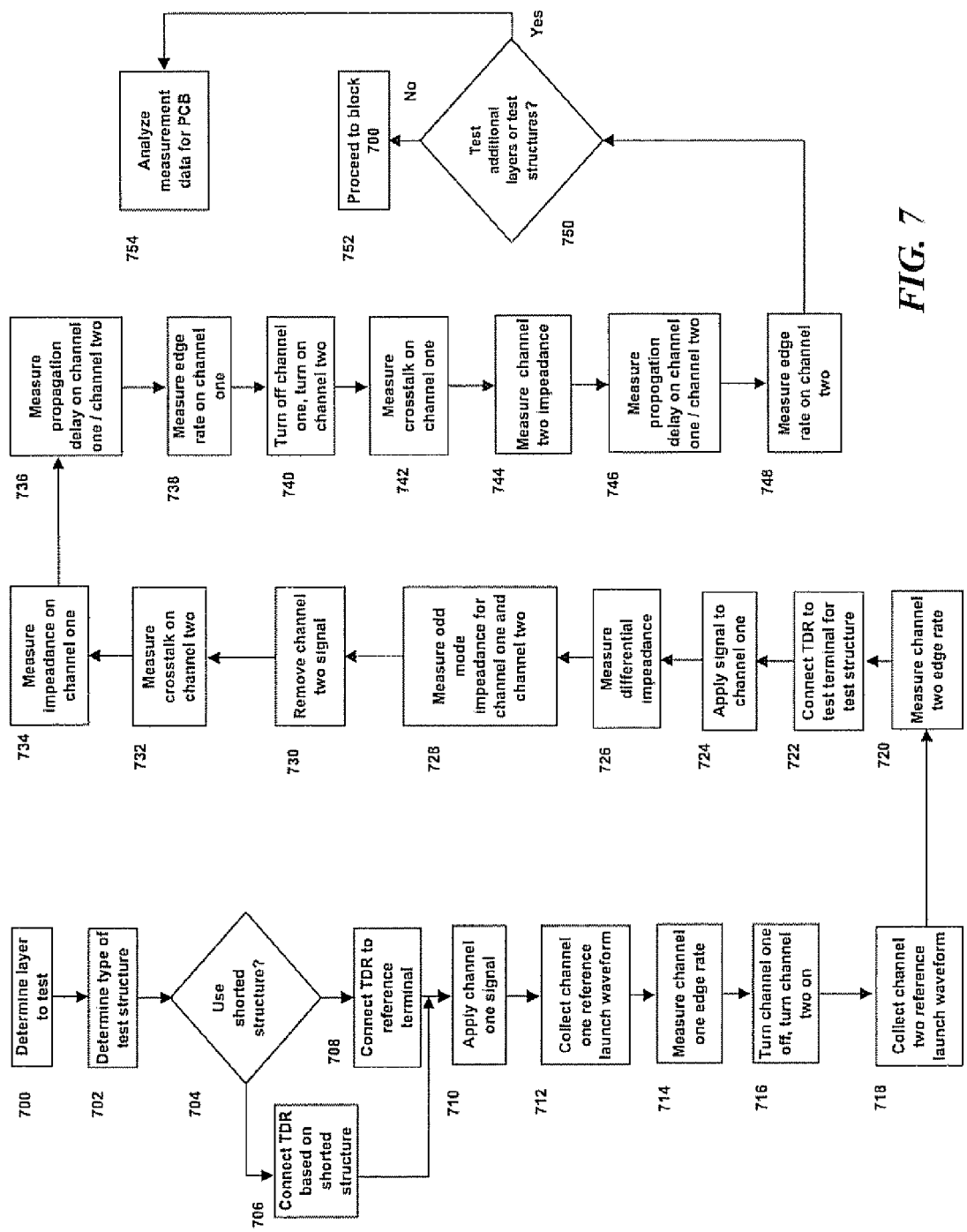
FIG. 7 presents a flow diagram for testing a printed circuit board according to one aspect of the disclosure.

FIG. 7 presents a flow diagram for testing a printed circuit board according to one aspect of the disclosure. The method of FIG. 7 can be employed in whole or in part by an information handling system, test system, device, component, or any combination thereof, operable to employ the method of FIG. 7. Additionally, the method can be embodied in various types of encoded logic or computer readable mediums such as software, firmware, hardware, or other forms of encoded logic or computer readable mediums that can provide all or portions of the method of FIG. 7.

The method begins at decision block 700 and determines a layer of a PCB to test. For example, a PCB may be a single layer PCB, such as the PCB 500 illustrated in FIG. 5, or a multi-layered PCB such as multi-layered PCB 600 illustrated in FIG. 6. Upon determining a layer to test, the method proceeds to block 702 and a type of test structure to test can be determined. For example, a shorted test structure, such as test structure 300 illustrated in FIG. 3 can be provided at the test layer. In another embodiment, an open-ended test structure, such as the test structure 400 illustrated in FIG. 4, may be provided at second inner bus layer. In one form, a shorted or opened test structure can also be tested. Upon determining the type of test structure to test, the method can proceed to block 704, and a TDR can be connect to a reference terminal of the test structure. For example, a reference terminal, such as reference terminal 412 illustrated in FIG. 4 can be connected to the TDR. Additionally, the TDR can include a two-channel connection. For example, the TDR can include a channel one and channel two connections for outputting and receiving test signals for testing the test structure. In one form, the TDR, the test structure, or any combination thereof, can include a shorting bar or shorting element coupled to one or more test terminal or reference terminal of the test structure. For example, a short can be provided using a test connector associated with the TDR. In other forms, a short can be provided using a shorting bar or other type of connection operable to provide a short.

Upon connecting the TDR to the test structure, a signal can be provided to channel one at block 706. At block, 708, the channel one signal is received as a reference launch waveform using the second channel. The method then proceeds to block 710 and an edge rate for the channel one can be measured. For example, an edge rate can include measuring a transition time for at either the rise or fall of a waveform. In one form, the waveform can include a two-hundred fifty millivolts (250 mV) signal. A fall time can be determined at approximately eighty percent (80%) and twenty percent (20%) of the signal amplitude. Other ranges for measuring a fall time or rise time for an edge rate can also be used such as seventy percent (70%) to thirty percent (30%), ninety percent (90%) to ten percent (10%), or any other range as desired. In one form, a fall time can include a value of approximately fifty picoseconds (50 ps) for a test structure.

Upon measuring the edge rate for channel one, the method can then proceed to block 712 and channel one can be turned off (e.g. signal reduced to a minimal or zero value). Additionally, a signal can be further applied using channel two. For example, the signal applied to the second channel can be approximately the same as the signal provided using channel one. The method then proceeds to block 714 and a channel two reference launch waveform can be captured. The method then proceeds to block 716 and a channel two edge rate can be determined.

Upon determining a channel one and channel two edge rates for the test structure at a reference terminal, the method can proceed to block 718 and the TDR can be connected to a first set of test terminals for the test structure being tested. The method can then proceed to block 720 and a signal can be applied to channel two. The signal can include providing the same, or approximately the same, signal as the reference signal provided at block 712. Upon providing a signal using channel two, the method proceed to block 722 and a differential impedance can be measured. For example, a differential impedance can include measuring an impedance based on a difference in impedance for a first portion of a test structure and a second portion of a test structure. The method can then proceed to block 724 and an odd mode impedance can be measured for channel one and channel two. For example, an odd mode impedance measurement signal can be provided by the TDR and can include providing a positive step function to channel one and a negative step function to channel two. The TDR can measure an odd mode impedance for both channels. In one form, an impedance for a first portion of a test structure and a second portion of a test structure can include a value of approximately fifty (50) ohms. An odd mode impedance for the test structure can include a value of approximately forty-four (44) ohms. A differential impedance value for the test structure can include approximately eighty-eight (88) ohms (e.g. combination of channel one and channel two). Other measurement impedance values may also be determined. The method can then proceed to block 726 and the signal applied to channel two can be removed or reduced to zero.

The method then proceeds to block 728 and crosstalk voltage for channel two can be measured. For example, crosstalk can be measured by providing a signal level using channel one and sensing or detecting a signal using channel two. In one form, a crosstalk value of approximately eleven millivolts (11 mV) can be measured for a test structure. Other values can also be detected. Upon measuring the crosstalk voltage, the method can then proceed to block 730 and an impedance can be measured for channel one and at block 732, a propagation delay for channel one can be measured. A propagation delay can also be measured for channel two. For example, a propagation delay can include measuring the length of time a signal takes to propagate from one end of a test structure to the other. For example, a six (6) inch trace can include a propagation delay of approximately one (1) nanosecond. In one form, the propagation delay can be measured for a shorted test structure and can include the amount of time a signal takes propagate and return. For example, using a shorted six (6) inch test structure can result in a propagation delay of approximately two (2) nanoseconds. Other values can also be measured. The method can then proceed to block 734 and an edge rate for channel one can be measured.

Upon obtaining measurements for channel one, the method can then proceed to block 736 and channel one signal can be reduced or removed, and a signal can be applied to channel two. For example, the signal can include a value the same as the test signal applied to channel one at block 720. Upon applying a signal to channel two, a crosstalk value for channel one can be determined at block 738, and at block 740 an impedance value for channel two can be determined. The method can then proceed to block 742 and a propagation delay can be determined for channel one and channel two. The method then proceeds to block 744 and an edge rate for channel two can be measured.

Upon measuring operating characteristics for channel two, the method proceeds to decision block 746 and determines if there are additional layers, test structures, or any combination thereof, to be tested. If additional testing should be performed, the method can proceed to block 748 and to block 700 as desired. If there is no additional testing, the method proceeds to block 750 and the measurement data can be analyzed to determine if a PCB meets specific requirements for the layer and type of test structure tested. For example, the method of FIG. 8 or other methods as desired can be used to analyze the measured data to determine if a PCB and associated test structure meets an acceptable performance requirement or specification.

According to one aspect, the method of FIG. 7 can be modified to include various portions of the method of FIG. 7. For example, a PCB may only require testing to determine impedance and crosstalk values for a test structure. As such, the method may be modified as desired to include any combination of tests. In another form, as additional test types are determined to be beneficial for testing a PCB, additional tests can be added to a portion, or all of, the method of FIG. 7 as desired.

Figure 8:
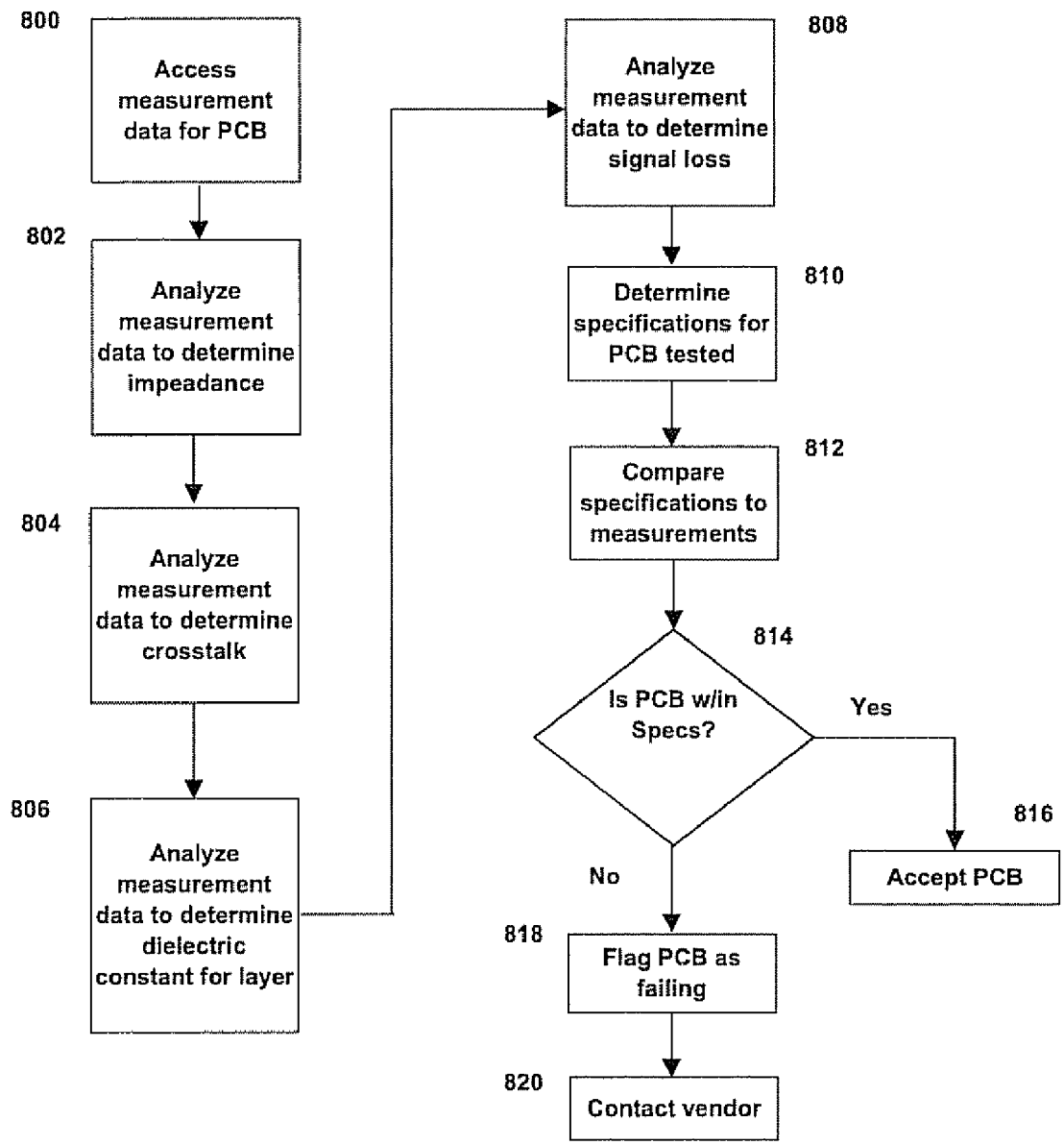
FIG. 8 presents a flow diagram for characterizing a printed circuit board using test measurements according to one aspect of the disclosure.

FIG. 8 presents a flow diagram for characterizing a printed circuit board using test measurements according to one aspect of the disclosure. The method of FIG. 8 can be employed in whole or in part by an information handling system, test system, device, component, or any combination thereof, operable to employ the method of FIG. 8. Additionally, the method can be embodied in various types of encoded logic or computer readable mediums such as software, firmware, hardware, or other forms of encoded logic or computer readable mediums that can provide all or portions of the method of FIG. 8.

The method of FIG. 8 can be used to test a PCB having one or more test structures in association with at least one layer of a PCB. For example, the method of FIG. 8 can be used in association with the PCB 200 illustrated in FIG. 2, the PCB 500 illustrated in FIG. 5, the multi-layered PCB 600 illustrated in FIG. 6, or various other types of PCBs, or any combination thereof. As such, the method of FIG. 8 can be used to analyze measurement data obtained by testing test structures at a specific test layer for a PCB to determine if a PCB is within a desired specification. The method begins at block 800 when measurement data for a PCB is accessed. For example, measurement data can be stored within a database, file, or various other storage mediums operable to store measurement data, and accessed in association with characterizing or testing a PCB to determine if the PCB is within an acceptable tolerance.

Upon accessing measurement data, the method proceeds to block 802 and the measurement data is analyzed to determine an impedance in association with the test structure tested. For example, an impedance analysis can include determining a differential impedances, a "Zodd" impedance, channel one impedance, channel two impedance, a nominal impedance, or any combination thereof. Upon determining one or more impedance values, the method proceeds to block 804 and the measurement data can be analyzed to determine one or more crosstalk values for the PCB. In one form, a crosstalk value can include a measured voltage level for a specific test structure and at a specific layer tested. For example, a test structure having a trace width of approximately five (5) one thousandth and a trace width separation of approximately six (6) one thousandths may produce an acceptable crosstalk voltage of approximately ten (10) to twelve (12) millivolts. In one form, a crosstalk specification value for a board can include plus, or minus, twenty-five percent (e.g. +/−25%) of eleven millivolts (11 mV). Other crosstalk specification values can also be used based on the type of PCB and end user system demands.

Upon determining a crosstalk voltage, the method can proceed to block 806 and determine a dielectric constant for one or more layers of the PCB. For example, dielectric constants for various traces and bus layers can have a dependency on adjacent layers, trace width of a test structure, distance between traces, materials used, etc. Additionally, an effective relative dielectric constant values can also be determined. For example, an effective relative dielectric constant value can include determining a dielectric constant value for specific layers for a PCB. The PCB can include multiple inner layers to form a specific layer. For example, a dielectric constant specification for an inner layer can include can include values of approximately three and a half (3.5) to approximately four and six tenths (4.6). Other dielectric constant specification values can also be achieved based on the types of materials used to form one or more inner layers of the PCB. In one form, a propagation delay measurement can be used to determine a dielectric constant value.

The method can then proceed to block 808 and signal loss for the PCB can be determined. For example, a measured reference edge rate value can be used to determine a reference value for a signal. The measured reference edge rate value can be compared to a tested edge rate value obtained from the test structure. In one form, the signal loss can include the difference between measured reference edge rate value and the tested edge rate value. For example, as the value for a tested edge rate decreases, the overall signal loss would increase.

The method then proceeds to block 810 and determines specifications for the PCB tested. For example, the PCB may be an application specific PCB and may be used. In a relative high performance operating environment. In other forms, the PCB may be used in association lower relative performance environment. As such, the specifications for a specific PCB can be determined, and the method can proceed to block 812. At block 812, the analyzed data for each test can be compared to the PCB specification. For example, specifications for a specific type of test structure provided at a specific layer can be determined for comparison. The method can then proceed to block 814 and determine if the PCB meets the required specification by comparing the PCB specifications to the analyzed measurement data. If the PCB is within tolerance, the method proceeds to block 816 and the PCB is accepted. If the PCB does not meet the PCB specifications, the method proceeds to block 818 and the PCB can be flagged as failing to meet the required specification. In one form, an output of one or more measurement values can be produced in association with the failing PCB to indicate how the PCB failed. At block 820, a vendor that manufactured the PCB can be contacted to inform the vendor of the failing PCB and one or more failing parameters or test values can be provided to the PCB manufacturer.

Various factors can influence measurements such as the quality of the printed circuit board material, the trace width of each conductive element, the spacing of each conductive element, and various other factors. For example, an increase in crosstalk voltage levels may be detected due to the type of material used as a substrate material for one or more layers of a PCB as some materials that may be more susceptible to greater crosstalk voltage levels. In another embodiment, the overall dimension of a trace width for a test structure and an associated data bus can be out of specification, and may cause an increase in crosstalk voltage levels measured. In another form, the test structure may have been etched improperly or the dielectric thickness of the PCB may be incorrect. For example, an increase layer width may be determined from detecting an increase in a dielectric constant value and a decrease in crosstalk voltage between layers. However, in other embodiments, a decrease in layer width can cause an overall decrease in dielectric constant values but an increase in crosstalk voltage between layers. Various other types of analysis can also be used.

As such, PCB material quality and PCB fabrication processes can be monitored by testing or characterizing test structures provided within a PCB. For example, design specifications for a specific PCB can be characterized to determine an expected performance of the PCB. Additionally, a single test instrument, such as a TDR, may be used to make multiple measurements to characterize the PCB without having to resort to complicated test procedures. For example, through taking a reference measurement using a reference terminal of a test structure, and then taking a test measurements using an associated test terminal of a test structure, reduces test set-up and complexity. For example, use of various different types of expensive lab equipment and software applications, which may not be compatible for use within HVM environments, can be avoided. In this manner, a reduction in man-hours and resources for testing test structures within HVM environments can be realized. According to one aspect, a test system can include a TDR.

The above-disclosed subject matter is to be considered illustrative, and not restrictive, and the appended claims are intended to cover all such modifications, enhancements, and other embodiments that fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A printed circuit board comprising:
   a first test structure located within the printed circuit board at a first bus layer, the first test structure including:
   a first elongated conductive element extending along a length of the printed circuit board, the first elongated conductive element including a first width;
   a second elongated conductive element extending approximately parallel to the first elongated conductive element, the second elongated conductive element including approximately the length and the first width; and
   an expected crosstalk value measurable by applying a test signal to the first elongated conductive element and measuring a crosstalk voltage using the second elongated conductive element.

2. The printed circuit board of claim 1, wherein the first test structure includes a shorted test structure.

3. The printed circuit board of claim 1, wherein the first bus layer includes a first bus trace width approximately equal to the first width.

4. The printed circuit board of claim 1, wherein the first test structure includes an expected signal loss value.

5. The printed circuit board of claim 4, wherein the first test structure includes an expected impedance value and a dielectric constant value.

6. The printed circuit board of claim 1, further comprising a second test structure provided at a second bus layer within the printed circuit board.

7. The printed circuit board of claim 6, further comprising:
   a second data bus provided at the second bus layer, the second data bus including a second data bus trace having a second data bus trace width; and
   wherein the second test structure includes a second test structure conductive element with a trace width approximately equal to the second data bus trace width.

8. The printed circuit board of claim 7, further comprising:
   a second expected dielectric constant value measurable using the second test structure; and
   a second expected crosstalk value associated with the second data bus and measurable using the second test structure.

9. An information handling system comprising:
   a printed circuit board; and
   a first test structure located within the printed circuit board at a first bus layer, the first test structure including:
   a first elongated conductive element provided at a first inner bus layer, the first elongated conductive element including:
   a first length; and
   a first width approximately equal to a trace width of a bus line provided in association with a first bus located within the first inner bus layer;
   a second elongated conductive element provided at the first inner bus layer, the second elongated conductive element including:
   a second length approximately equal to the first length; and
   a second width approximately equal to the first width; and
   an expected crosstalk value associated with the test structure, the expected crosstalk value measurable by coupling a test signal to the first elongated conductive element and detecting a crosstalk voltage using the second elongated conductive element.

10. The information handling system of claim 9, further comprising a shorting element coupled to the first elongated conductive element and the second elongated conductive element.

* * * * *